United States Patent
Kawamura et al.

(10) Patent No.: US 12,332,489 B2
(45) Date of Patent: Jun. 17, 2025

(54) OPTO-ELECTRONIC INTEGRATED MODULE

(71) Applicant: Nippon Telegraph and Telephone Corporation, Tokyo (JP)

(72) Inventors: Yuriko Kawamura, Musashino (JP); Kiyofumi Kikuchi, Musashino (JP); Ken Tsuzuki, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 349 days.

(21) Appl. No.: 18/007,635

(22) PCT Filed: Jun. 5, 2020

(86) PCT No.: PCT/JP2020/022253
§ 371 (c)(1),
(2) Date: Dec. 1, 2022

(87) PCT Pub. No.: WO2021/245907
PCT Pub. Date: Dec. 9, 2021

(65) Prior Publication Data
US 2023/0244045 A1  Aug. 3, 2023

(51) Int. Cl.
*G02B 6/42* (2006.01)

(52) U.S. Cl.
CPC ......... *G02B 6/4269* (2013.01); *G02B 6/4231* (2013.01)

(58) Field of Classification Search
CPC ...... G02B 6/42; G02B 6/4269; G02B 6/4231; G02B 6/12
See application file for complete search history.

(56) References Cited

U.S. PATENT DOCUMENTS 8,483,253 B2 * 7/2013 Budd .................... H10F 39/107
372/50.23
9,543,226 B1 * 1/2017 Nuttall ................... H01L 23/13

OTHER PUBLICATIONS

Maki, Jeffery J., *Evolution of Pluggable Optics and What is Beyond*, Optical Fiber Communication Conference, Optical Society of America, 2019, pp. 1-3.

* cited by examiner

*Primary Examiner* — Tina Wong
(74) *Attorney, Agent, or Firm* — Workman Nydegger

(57) ABSTRACT

In an integrated optoelectronic module according to the present disclosure, a heat dissipation path for an electric integrated circuit (IC) for signal processing, which consumes a relatively large amount of power, and a heat dissipation path for an electric IC for driving an optical circuit are separated from each other. The electric IC for driving an optical circuit is mounted on a connection surface of a photonic IC in the state in which a connection surface of the electric IC for driving an optical circuit faces the connection surface of the photonic IC. The electric IC for driving an optical circuit is housed in a depressed portion formed at a portion in a substrate on a connection surface side coupled to a photonic IC. The bottom portion of the depressed portion is thermally coupled to a non-connection surface of the electric IC for driving an optical circuit.

8 Claims, 8 Drawing Sheets

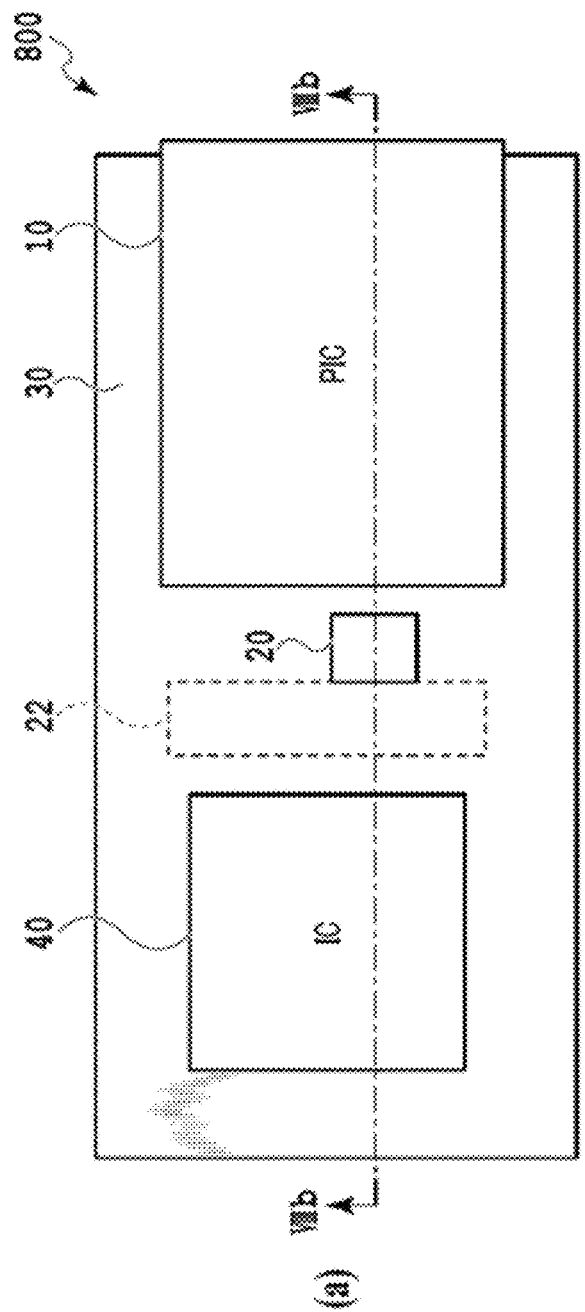
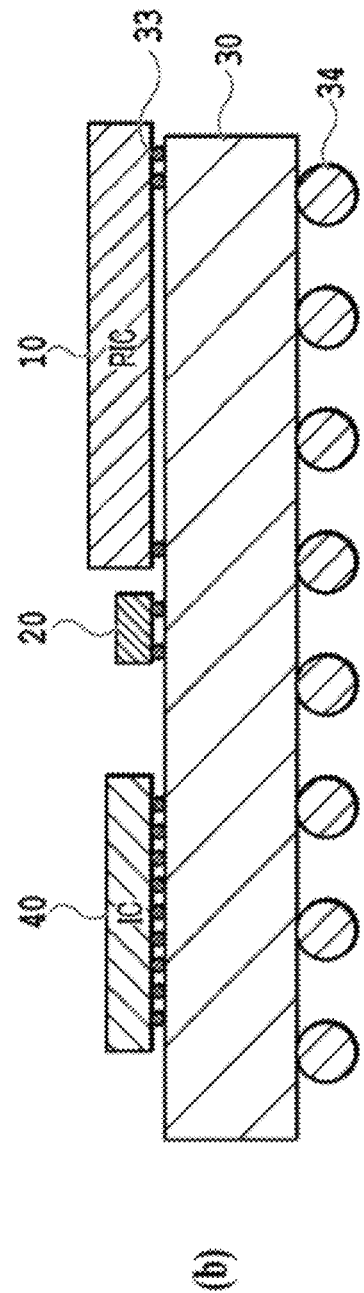
Fig. 8
Prior Art

OPTO-ELECTRONIC INTEGRATED MODULE

TECHNICAL FIELD

The present invention relates to an integrated optoelectronic module formed by integrating an optical device and an electronic device.

BACKGROUND ART

Against the backdrop of rapidly increasing demands for telecommunications, studies have been actively conducted to implement high-capacity communication networks. As for optical communication systems and optical information processing systems, there are demands for increased bit rate per unit volume of communication equipment or processing devices. Integrated optoelectronic modules, which are structured by mounting an electronic integrated circuit chip and a photonic integrated circuit chip with high density, are expected to contribute to implementation of high-speed high-capacity communication equipment.

As described in Non-Patent Literature 1, the Consortium for On-Board Optics (COBO), which is a standards organization, has developed and set form factors for 400 Gbs optical transceivers. The optical transceivers are an example of the integrated optoelectronic modules, and studies about mounting a switching electronic circuit and an optical component on the same substrate have been conducted. A large-scale application-specific integrated circuit (ASIC) and an optical receive component are arranged close to each other; this kind of mounting applications are referred to as on-board optics (OBOs).

CITATION LIST

Non-Patent Literature

Non-Patent Literature 1: Maki, Jeffery J. "Evolution of Pluggable Optics and What Is Beyond" Optical Fiber Communication Conference, Optical Society of America, 2019

SUMMARY OF THE INVENTION

Technical Problem

For the integrated optoelectronic modules, however, a problem arises in which increasing the degree of integration makes design for heat dissipation difficult. Circuits for dealing with electrical signals in the integrated optoelectronic modules include large-scale ASICs such as a digital-signal processor (DSP) that mainly processes signals at high speed and integrated circuits (ICs) with low degree of integration that includes an electric element for mainly driving an optical circuit. The electric ICs for high-speed signal processing such as the DSP generate a very large amount of heat, and thus, such electric ICs need to have a heat dissipation structure of a significant performance level. By contrast, the electric ICs for driving optical circuits need to be positioned as close to an optical circuit including components such as an optical modulator as possible.

FIG. 8 illustrates a structure of an integrated optoelectronic module of related art. In FIG. 8, (a) is a top view of a substrate surface; and (b) is a side view of a section of the substrate taken along line VIIIb-VIIIb. In an integrated optoelectronic module 800, a photonic integrated circuit (PIC) 10, an electric IC 20 for driving an optical circuit, and an electric IC 40 for signal processing, such as a DSP, are mounted on a substrate 30 with solder balls or gold bumps 33 interposed therebetween. Solder balls 34 are provided on a lower-surface side of the substrate 30. The solder balls 34 enable mounting on a device. An electrical signal wiring region 22 is provided between the electric IC 40 and the photonic IC 10, but wires are not illustrated in the drawings. For example, transmit electrical signals to be transmitted that are generated by being processed by the electric IC 40 for signal processing or received electrical signals from a photodetector (PD) in the photonic IC 10 may pass through the wiring region 22.

Along with increases in the degree of integration of the integrated optoelectronic module 800 and decreases in the size of the integrated optoelectronic module 800, demands arise for close arrangement of the electric IC 40 for signal processing such as a DSP, which generates a relatively large amount of heat generation, and the electric IC 20 for driving an optical circuit. Because both decreases in the size of the module and increases in the speed of electrical signal processing are required at the same time, it is also necessary to reduce the electrical signal wiring region 22 and shorten electrical signal wires as much as possible. However, when the electric IC 20 for driving an optical circuit is disposed close to the electric IC 40 for signal processing as a large heat source, it is difficult to create a design for heat dissipation from the electric IC 20.

In general, in a design for heat dissipation of a device, it is desirable that, when components should not affect each other, the components be arranged apart from each other by given distances or spaces. However, when the electric IC 40 for signal processing and the electric IC 20 for driving an optical circuit are spaced apart from each other, a problem arises in which the signal bandwidth is limited because signal wires in the electrical signal wiring region 22 are elongated.

The present invention has been made in view of the problem, and an object thereof is to provide an integrated optoelectronic module having a heat dissipation structure suitable for size miniaturization and high density integration.

Means for Solving the Problem

To achieve this object, an aspect of the present invention provides an integrated optoelectronic module including a substrate, a photonic integrated circuit (IC) mounted on the substrate with a plurality of connections interposed between the photonic IC and the substrate, a first electric IC mounted to face a connection surface of the photonic IC and electrically coupled to the photonic IC with a plurality of connections interposed between the first electric IC and the photonic IC, and a second electric IC mounted on the substrate with a plurality of connections interposed between the second electric IC and the substrate. The first electric IC is housed in a depressed portion formed in the substrate inside a region corresponding to the photonic IC when a substrate surface is viewed, and a bottom surface of the depressed portion is connected to an opposite surface of the first electric IC, the opposite surface being opposite to a connection surface of the first electric IC, with a filler interposed between the depressed portion and the first electric IC.

Another aspect of the present invention provides a device including the integrated optoelectronic module described above and a casing holding the integrated optoelectronic module and having a first casing surface thermally coupled to an opposite surface of the second electric IC, the opposite surface being opposite to a connection surface of the second electric IC, and a second casing surface thermally coupled, with the filler, to an opposite surface of the substrate opposite to the connection surface of the photonic IC.

Effects of the Invention

It is possible to provide a new heat dissipation structure suitable for size miniaturization and high density integration of an integrated optoelectronic module.

BRIEF DESCRIPTION OF DRAWINGS

FIG. 8 illustrates a structure of an integrated optoelectronic module of related art.

DESCRIPTION OF EMBODIMENTS

In an integrated optoelectronic module according to the present disclosure, a heat dissipation path for an electric integrated circuit (IC) for signal processing, which consumes a relatively large amount of power, and a heat dissipation path for an electric IC for driving an optical circuit are separated from each other in the module. The electric IC for driving an optical circuit is disposed over a connection surface of a photonic IC in the state in which a connection surface of the electric IC for driving an optical circuit faces the connection surface of the photonic IC. The electric IC for driving an optical circuit is housed in a depressed portion (cavity) formed at a portion of a connection surface side of a substrate coupled to the photonic IC. A heat dissipation path for the electric IC for driving an optical circuit is formed by thermally connecting a bottom portion of the depressed portion (cavity) formed at the substrate surface to a non-connection surface (upper surface) of the electric IC for driving an optical circuit.

In the following description, a connection surface of an IC or substrate denotes, when the IC or substrate has a first surface and a second surface on the opposite (back) side with respect to the first surface, a surface mechanically or electrically coupled to another substrate or component by a connection such as a solder joint or bump. When an IC is formed as a bare chip, a connection surface of the chip is usually a circuit surface having elements such as an electronic circuit element and an optical circuit element. Hereinafter, various embodiments of the integrated optoelectronic module according to the present disclosure will be described with reference to the drawings. In the series of drawings, portions having the same function are assigned the same number.

First Embodiment

Figure 1:
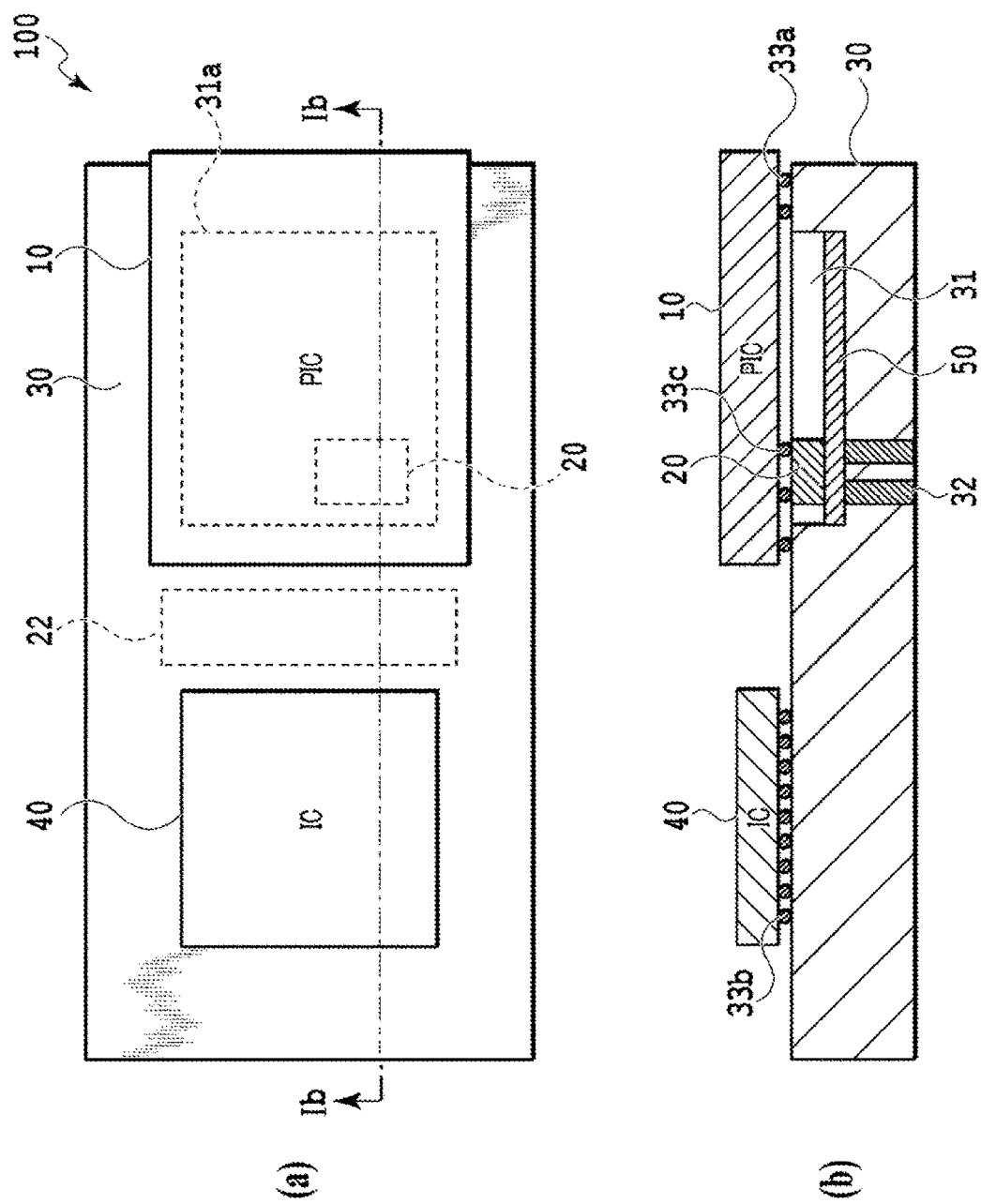
FIG. 1 illustrates a structure of an integrated optoelectronic module according to a first embodiment.

FIG. 1 illustrates a structure of a first embodiment of the integrated optoelectronic module according to the present disclosure. In FIG. 1, (a) is a top view of a substrate surface; and (b) is a side view of a section taken along line Ib-Ib. In all the structure drawings of integrated optoelectronic modules described below, measurements in the thickness direction of each substrate are usually enlarged as compared to measurements in the lateral direction, and relative relationships of actual dimensions of individual portions are not presented in an exact manner in the drawings. It should be noted that each portion is illustrated in a size different from the actual size for convenience of description and viewing.

In an integrated optoelectronic module 100, the photonic IC (PIC) 10 and the second electric IC 40 are coupled on the substrate 30 with a plurality of connections 33a and 33b interposed therebetween. The plurality of connections 33a and 33b may be, but not limited to, solder balls or gold bumps. Instead of being mounted on the substrate 30 as in the related art illustrated in FIG. 8, a first electric IC 20 is disposed on a connection surface side of the photonic IC 10 while facing the photonic IC 10. As indicated by a dotted line region 20 in the top view in (a) of FIG. 1, the first electric IC 20 is disposed on the connection surface (back surface) side with respect to the photonic IC 10 in the state in which the photonic IC 10 is mounted on the substrate.

Referring to the sectional view in (b) of FIG. 1, a space (cavity) of a depressed portion 31 capable of housing the first electric IC 20 is formed at a portion of a connection surface side of the substrate 30 toward the photonic IC 10. The depressed portion 31 forms a space with a bottom surface depressed from a surface of the substrate 30. The depressed portion 31 has a flat bottom surface formed at a position deeper than the height of the first electric IC 20. The bottom portion of the depressed portion 31 is not in direct contact with a non-connection surface (surface opposite to the connection surface) of the first electric IC 20. In the following description, for ease of reference, the depressed portion is also referred to as the cavity 31.

In the top view in (a) of FIG. 1, the cavity 31 corresponds to a dotted line region 31a inside the outline of the photonic IC 10. The bottom portion of the cavity 31 is filled with a filler 50 contacting a surface (upper surface) of the first electric IC 20 opposite to the connection surface. Heat dissipation vias 32 are formed at positions substantially corresponding to the first electric IC 20 in the substrate 30 immediately under the bottom portion of the cavity 31 when viewed in the top view in (a) of FIG. 1.

In FIG. 1, (a) and (b) illustrate the cavity 31 as a parallelepiped (plate-like) depressed portion, but the shape of the cavity 31 is not limited to this example as will be described in other embodiments. The cavity 31 can be formed in various shapes when the cavity 31 can house the first electric IC 20 disposed facing the connection surface of the photonic IC 10, and the plurality of connections 33a to the photonic IC 10 can be arranged on the substrate 30 outside the region 31a of cavity.

The second electric IC 40 in the integrated optoelectronic module 100 is an IC for high-speed signal processing. The second electric IC 40 may be, for example, a digital-signal processor (DSP) that generates a very large amount of heat. The second electric IC 40 may be implemented by a chip (die) formed by cutting a semiconductor substrate having electronic elements or by a semiconductor chip mounted on, for example, an interposer or frame. Alternatively, the second electric IC 40 may be implemented by a packaged chip formed by molding an entire semiconductor chip. As illustrated in (b) of FIG. 1, the second electric IC 40 formed as a bare chip can be flip-chip mounted on the substrate 30 by using connections 33c such as solder balls or gold bumps. The second electric IC 40 may be mounted on the substrate 30 by using any connection method according to its form. A single second electric IC 40 is illustrated in FIG. 1, but two or more electric ICs 40 for signal processing may be provided on the substrate 30.

The photonic IC 10 is formed by constructing an electronic element, an optical element, and an optical circuit on a substrate made of a semiconductor or other materials. The photonic IC 10 may be a chip (die) formed by cutting a substrate. The photonic IC 10 may be, for example, an IC formed on an InP or silicon substrate. The photonic IC 10 may be implemented, in accordance with the function to be implemented, by a module formed by arranging the photonic IC 10 together with other components including an optical component and an electronic component on a substrate or in a package. A silicon photonics chip or a silica-based planar lightwave circuit (PLC) chip may be used as the photonic IC 10.

The photonic IC 10 formed as a bare chip may be flip-chip mounted on the substrate 30 by using the connections 33a such as solder balls or gold bumps as illustrated in (b) of FIG. 1, or the photonic IC 10 may be mounted on the substrate 30 by using other methods. The photonic IC 10 is electrically coupled to the substrate 30 by using the connections 33a in a peripheral portion close to the outer edge of the photonic IC 10 when viewed in the top view in (a) of FIG. 1. The cavity 31 is formed in the region 31a inside the region including the connections 33a arranged on the photonic IC 10. Further inside the region 31a of cavity, the first electric IC 20 described below is coupled to the photonic IC 10.

The first electric IC 20 is formed by including in an integrated manner an electronic driver device for supplying electrical signals to, for example, a modulator in the photonic IC 10. The first electric IC 20 may be typically implemented by a chip (die) formed by cutting a semiconductor substrate having electronic devices or by a semiconductor chip mounted on, for example, an interposer or frame. Alternatively, the first electric IC 20 may be implemented by a packaged chip formed by molding an entire semiconductor chip.

The electrical signal wiring region 22 is provided on the substrate 30 between the second electric IC 40 and the photonic IC 10. The electrical signal wiring region 22 is a region including a wire for high-frequency electrical signals from the second electric IC 40. The electrical signal wiring region 22 is formed as a transfer line having a particular magnitude of characteristic impedance to avoid loss and reflection of high-frequency signal. The substrate 30 needs to have sufficient strength and heat transfer capability and also avoid loss of high-frequency signal, and hence, for example, a ceramic or organic material substrate may be used as the substrate 30. The electrical signal wiring region 22 may include, in addition to the electric wire, a chip capacitor and other integrated electronic components.

As described above, the integrated optoelectronic module according to the present disclosure include the substrate 30, the photonic integrated circuit (IC) 10 mounted on the substrate with the plurality of connections 33a interposed between the photonic IC and the substrate, the first electric IC 20 mounted to face the connection surface of the photonic IC and electrically coupled to the photonic IC with the plurality of connections 33c interposed between the first electric IC 20 and the photonic IC, and the second electric IC 40 mounted on the substrate with the plurality of connections 33b interposed between the second electric IC and the substrate. The first electric IC is housed in the depressed portion 31 formed in the substrate inside the region 31a corresponding to the photonic IC when a substrate surface is viewed, and the bottom surface of the depressed portion 31 is connected to an opposite surface of the first electric IC, the opposite surface being opposite to a connection surface of the first electric IC, with the filler 50 interposed between the depressed portion 31 and the first electric IC.

The first electric IC 20 has, for example, a function of amplifying an electrical signal for modulation from a DSP to a current/voltage level required to operate an optical modulator (for example, Mach-Zehnder modulator or electro-absorption (EA) modulator) and supplying the amplified electrical signal for modulation. In the example of an optical transceiver, although the number of electrical signals varies depending on the modulation method, the number of multiplexing, and the signal transfer mode (single-ended or differential), or the like, an optical transceiver usually deals with up to about several tens of electrical signals. The first electric IC 20 is usually smaller in size than the second electric IC 40 configured to process signals at high speed such as a DSP. The first electric IC 20 usually generates heat less than the second electric IC 40. The functionality of the first electric IC 20 may include amplifying an electrical signal from a photodetector (PD) in the photonic IC 10 and supplying the amplified electrical signal to the second electric IC 40. Thus, the first electric IC may be an electric IC serving as an interface that provides connection to an optical circuit. A single first electric IC 20 is illustrated in FIG. 1, but two or more electric ICs for driving an optical circuit may be provided.

The configuration of the integrated optoelectronic module according to the present disclosure is different from the second electric IC 40 for high-speed signal processing with respect to the device type, the range of operational voltage/current, and the functionality, and thus, the integrated optoelectronic module according to the present disclosure can be used for a wide variety of devices including electric ICs different from the second electric IC 40. It should be noted that the functionality of the first electric IC 20 is not limited to driving an optical circuit.

In the integrated optoelectronic module 800 of the related art illustrated in FIG. 8, the electric IC 20 for driving an optical circuit is disposed between the electrical signal wiring region 22 and the photonic IC 10 on the substrate 30; and an electrical signal after driving is inputted to the photonic IC 10 through the first electric IC 20. In the integrated optoelectronic module 100 according to the present disclosure, the first electric IC 20 for driving an optical circuit is not disposed on the substrate 30. As a result, an electrical signal from the electrical signal wiring region 22 is firstly inputted to the photonic IC 10 through the connections 33a close to the wiring region 22. The electrical signal inputted to the photonic IC 10 is inputted to the first electric IC 20 through one or some of the connections 33c. The electrical signal is driven to a predetermined level by the electronic device in the first electric IC 20 and supplied again to the photonic IC 10 through another or others of the connections 33c.

In the integrated optoelectronic module 100 according to the present embodiment, the photonic IC 10 and the first electric IC 20 are electrically coupled to each other in the state in which the connection surface of the photonic IC 10 faces the connection surface of the first electric IC 20. The photonic IC 10 is mounted on the substrate 30 similarly to the related art, and thus, the first electric IC 20 is mounted on the connection surface of the photonic IC 10, that is, the lower surface of the mounted photonic IC 10, in the state in which the upper and lower surfaces of the first electric IC 20 are reversed (the first electric IC 20 is turned over). In the case of the first electric IC 20 formed as a bare chip illustrated in (b) of FIG. 1, the first electric IC 20 is flip-chip mounted on the photonic IC 10 formed as a bare chip with the connections 33c such as solder balls and gold bumps interposed therebetween. In the structure in (b) of FIG. 1, both the photonic IC 10 and the first electric IC 20 are flip-chip mounted, and consequently, the circuit formation surfaces of the two chips face each other. The method of mounting the first electric IC 20 on the photonic IC 10 is not limited to flip-chip mounting; the first electric IC 20 may be mounted on the connection surface of the photonic IC 10 by wire bonding. The photonic IC 10 may be flip-chip mounted on the substrate 30 in the state in which the first electric IC 20 is mounted on the photonic IC 10 by wire bonding.

In the integrated optoelectronic module according to the present disclosure, the photonic IC 10 and the first electric IC 20 are mounted on the connection surface side of the photonic IC 10, and the photonic IC 10 and the first electric IC 20 are electrically coupled to each other in the state in which the connection surface of the photonic IC 10 and the connection surface of the first electric IC 20 face each other; and at the same time, a new heat dissipation path can be formed between the non-connection surface of the first electric IC 20 and the bottom surface of the cavity 31. The non-connection surface of the first electric IC 20 not facing the photonic IC 10 is in contact with the filler 50 in the bottom portion of the cavity 31, so that the non-connection surface of the first electric IC 20 is thermally coupled to the heat dissipation vias 32. Because the first electric IC 20 is coupled to the heat dissipation vias 32 with the filler 50 interposed therebetween, the first electric IC 20 can be thermally coupled further to, for example, a casing housing the substrate 30 and another substrate in the device by using the heat dissipation structure. Connections to other heat dissipation structures will be described later in sixth and seventh embodiments.

Considering again the difference from the related art, the connection surface of the first electric IC 20 for driving an optical circuit is reversed with respect to the substrate 30, and a heat dissipation path is newly formed via the non-connection surface of the first electric IC 20. In the structure of the related art illustrated in FIG. 8, the first electric IC 20 and the second electric IC 40 use almost the same heat dissipation path, and thus, it is possible to transfer only the amount of heat determined by the thermal resistance of the substrate 30. In the integrated optoelectronic module 100 according to the present disclosure, a new heat dissipation path especially for the first electric IC 20 is provided by using a cavity, and as a result, it is possible to efficiently dissipate heat toward external devices regardless of the heat dissipation condition of the second electric IC 40 for signal processing that generates a relatively large amount of heat. In the integrated optoelectronic module, a new heat dissipation path is provided in parallel, and thus, the entire thermal resistance can be reduced.

With the structure of the related art, there is a concern that thermal effects on the first electric IC 20 may vary with time in response to the operational condition (for example, On or Off of the function) of the second electric IC 40, and the operational condition of the first electric IC 20 may also be affected. By contrast, in the structure of the integrated optoelectronic module according to the present disclosure, individual heat dissipation paths are provided for two electric ICs, so that the heat dissipation paths are different from each other. As a result, it is possible to reduce variations in thermal effects between the electric ICs such as variations in effects on the operation of the optical circuit in accordance with the operational condition of the DSP. It is expected that the stability of the integrated optoelectronic module is further improved. When the first electric IC 20 is used to drive an optical circuit, it is expected that the operational stability and reliability of the integrated optoelectronic module are improved by lowering the junction temperature of an amplification element in the first electric IC 20. In the integrated optoelectronic module according to the present disclosure, the second electric IC 40 can be disposed closer to the photonic IC 10 than the related art, and thus, the integrated optoelectronic module according to the present disclosure is preferable to widen the high frequency bandwidth characteristic of electrical signal while mitigating the problem of heat dissipation.

In the integrated optoelectronic module according to the present disclosure, for example, an underfill or adhesive having high heat dissipation capability may be used as the filler 50. Any filler can be used when the filler is made of a material having high heat conductivity, and the filler can function as a spacer for the first electric IC 20 in the cavity 31. For example, an acrylic-based elastic adhesive or heat dissipation paste may be used as a material for the underfill or adhesive.

In FIG. 1, (a) and (b) illustrate the example in which all the ICs are formed as bare chips and flip-chip mounted to couple each other, but at least the second electric IC 40 may be formed as a module. Further, the photonic IC 10 may have a structure for increasing heat dissipation efficiency, such as a through via.

Second Embodiment

Figure 2:
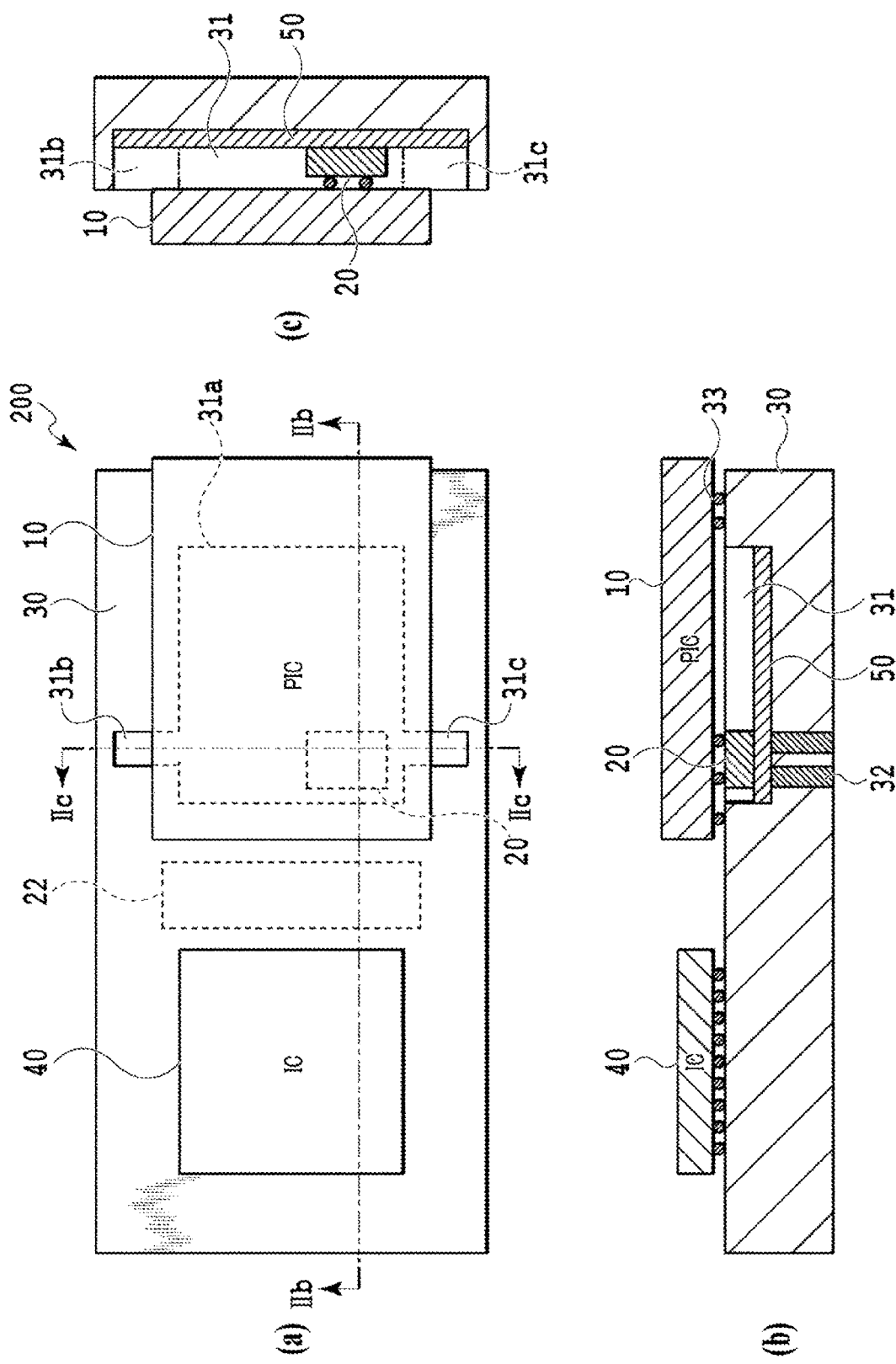
FIG. 2 illustrates a structure of an integrated optoelectronic module according to a second embodiment.

FIG. 2 illustrates a structure of a second embodiment of the integrated optoelectronic module according to the present disclosure. In FIG. 2, (a) is a top view of a substrate surface; (b) is a side view of a section taken along line IIb-IIb; and (c) is another side view of a section taken along line IIc-IIc. An integrated optoelectronic module 200 differs from the first embodiment only in the structure of a depressed portion formed in the substrate 30 to house the first electric IC 20, that is, the cavity 31; with respect to the basic structure, the integrated optoelectronic module 200 is identical to the integrated optoelectronic module 100 in FIG. 1. Thus, differences in the structure of the cavity 31 will be described below.

In the first embodiment, in the state in which the photonic IC 10 is mounted, the cavity 31 is covered by the entire photonic IC 10. For this reason, it is necessary to introduce the filler 50 into the cavity before the photonic IC 10 is mounted. The integrated optoelectronic module 200 according to the second embodiment has an inlet formed as an opening elongated contiguously from at least one inner surface of the cavity 31 to a side portion of the substrate 30 and being open at a substrate surface outside the region of the photonic IC 10. Specifically, as illustrated in (a) of FIG. 2, two openings 31b and 31c are provided; the openings 31b and 31c are elongated from two inner surfaces in the region 31a of cavity to end portions of the substrate 30 and are open at an upper surface of the substrate.

With the structure of cavity according to the present embodiment, the filler 50 can be introduced from the openings 31b and 31c, and thus, it is possible to introduce the filler 50 after the photonic IC 10 is mounted on the substrate 30. As a result, it is unnecessary to previously apply a filler on the substrate for flip-chip mounting. When the filler is introduced close to the connections on the substrate 30 to the first photonic IC 10, there is a concern that conditions for flip-chip mounting may change in response to the state of the introduced filler in the flip-chip process for the first photonic IC 10. With the structure of cavity of the integrated optoelectronic module according to the present embodiment, it is possible to avoid such a problem in conducting the flip-chip process. Moreover, a material incapable of resisting the temperature in the flip chip mounting process for the photonic IC 10 can be used as the filler. This enhances the flexibility in selecting a material of the filler 50.

Third Embodiment

Figure 3:
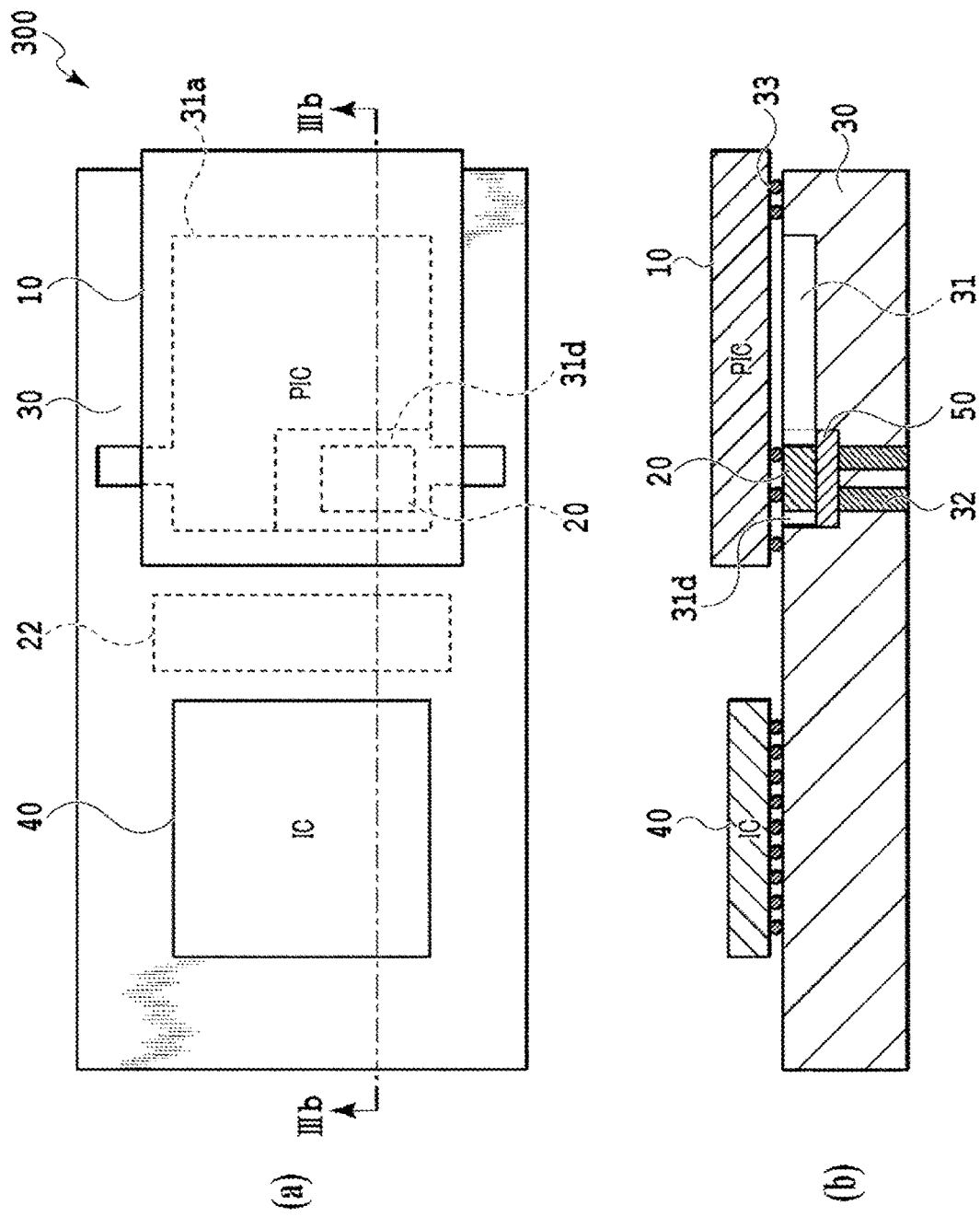
FIG. 3 illustrates a structure of an integrated optoelectronic module according to a third embodiment.

FIG. 3 illustrates a structure of a third embodiment of the integrated optoelectronic module according to the present disclosure. In FIG. 3, (a) is a top view of a substrate surface; and (b) is a side view of a section taken along line IIIb-IIIb. An integrated optoelectronic module 300 according to the third embodiment is constructed by further changing the structure of the bottom surface of the cavity 31 from the structure of the integrated optoelectronic module 200 illustrated in FIG. 2. The following is a description of this change.

Referring to the top view in (a) of FIG. 3, the integrated optoelectronic module 300 according to the present embodiment has a second cavity 31d in a region close to the first electric IC 20 within the region 31a of cavity; the second cavity 31d has a bottom surface formed at a deeper level. As illustrated in the sectional view in (b) of FIG. 3, the second cavity 31d has a second bottom surface formed at a deeper level in the thickness direction of the substrate. The second cavity 31d has the second bottom surface at a position deeper than the bottom surface of the cavity 31. The filler 50 is disposed in only the second cavity 31d.

Due to the difference in depth of bottom surface between the two cavities 31 and 31d, when the filler 50 is introduced after the photonic IC 10 is mounted on the substrate 30, it is possible to introduce the filler into only a portion immediately under the first electric IC 20. Basically, the filler 50 serving as a heat dissipation path is unnecessary at a position away from the portion at which the first electric IC 20 is in contact with the filler 50. When a filler is carelessly introduced into a position not relating to heat dissipation, a problem may arise in which, for example, the filler may cause a void. With the structure according to the present embodiment, it is possible to introduce only a necessary and sufficient amount of the filler 50 into only the second cavity 31d that is required to be filled with the filler. This can reduce a waste of the filler and also suppress the possibility that the filler cause faults.

Fourth Embodiment

Figure 4:
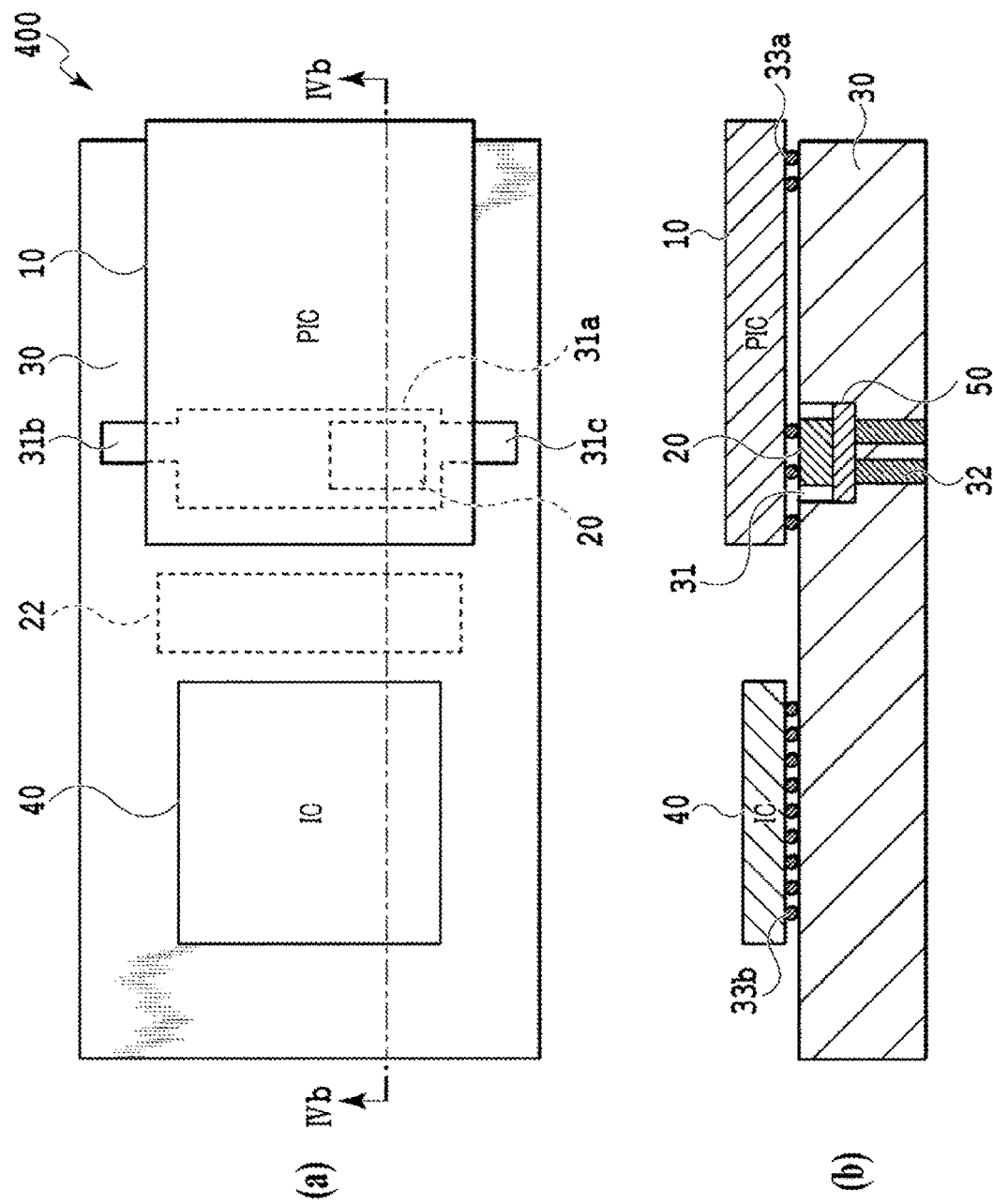
FIG. 4 illustrates a structure of an integrated optoelectronic module according to a fourth embodiment.

FIG. 4 illustrates a structure of a fourth embodiment of the integrated optoelectronic module according to the present disclosure. In FIG. 4, (a) is a top view of a substrate surface; and (b) is a side view of a section taken along line VIb-VIb. An integrated optoelectronic module 400 differs from the third embodiment only in the structure of the cavity 31; with respect to the basic structure, the integrated optoelectronic module 400 is identical to the integrated optoelectronic module 300 in FIG. 3. Thus, differences in the structure of the cavity 31 will be described below.

Referring to the top view in (a) of FIG. 4, as compared to the embodiments described above, the integrated optoelectronic module 400 according to the present embodiment has the cavity 31 and the openings 31b and 31c in the small region 31a limited close to the first electric IC 20. This means that the structure of the present embodiment is formed by reducing as much as possible the area of the region of the cavity 31 having the one-level bottom surface in the integrated optoelectronic module 200 according to the second embodiment. The structure of the present embodiment can also be considered as a structure formed by lifting the level of the bottom portion of the cavity 31 to the highest upper surface of the substrate 30 in the integrated optoelectronic module 300 according to the third embodiment.

By using the integrated optoelectronic module 400 according to the present embodiment, it is easy to introduce the filler from the openings 31b and 31c, and it is possible to introduce a minimum necessary amount of the filler 50 into the cavity 31 while having a heat dissipation path from the first electric IC 20.

Fifth Embodiment

Figure 5:
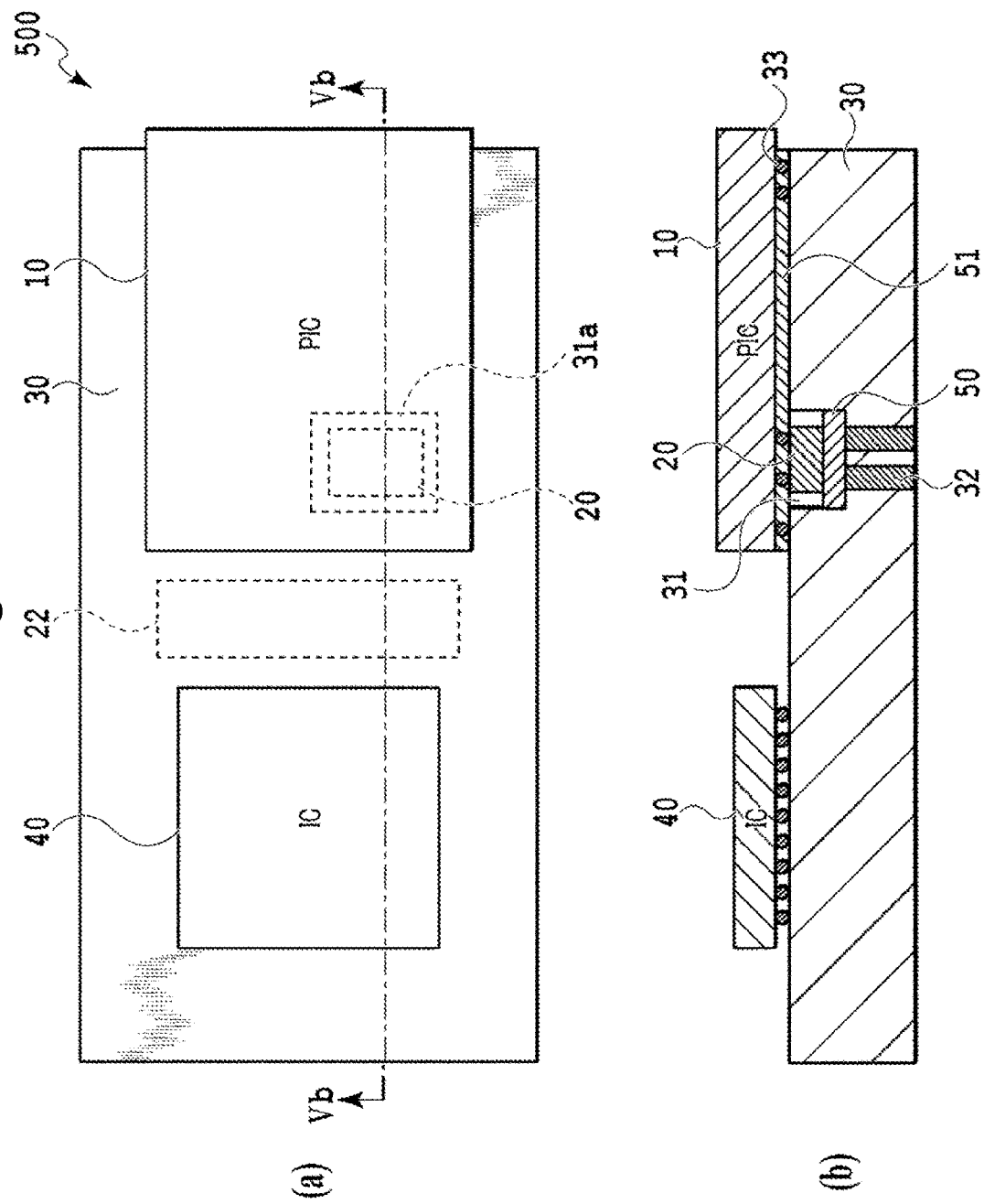
FIG. 5 illustrates a structure of an integrated optoelectronic module according to a fifth embodiment.

FIG. 5 illustrates a structure of a fifth embodiment of the integrated optoelectronic module according to the present disclosure. In FIG. 5, (a) is a top view of a substrate surface; and (b) is a side view of a section taken along line Vb-Vb. An integrated optoelectronic module 500 differs from the embodiments described above in the shape of the cavity 31 and the structure between the connection surface of the photonic IC 10 and the substrate 30; with respect to the basic structure forming an integrated optoelectronic module, the integrated optoelectronic module 500 is common to that in the first to fourth embodiments.

As illustrated in the top view in (a) of FIG. 5, the integrated optoelectronic module 500 according to the present embodiment is formed by reducing the region 31a of cavity as much as possible to the region immediately surrounding the first electric IC 20 in the integrated optoelectronic module 100 in FIG. 1. Unlike the second to fourth embodiments, no opening for introducing the filler is provided. Additionally, in the integrated optoelectronic module 500, the portion between the connection surface of the first electric IC 20 and the substrate 30 is filled with a filler 51. This can be achieved by an underfill application process for protecting the connections 33 when the first electric IC 20 is flip-chip coupled. In this underfill process, the introduction of the filler 50 into the portion between the first electric IC 20 and the bottom portion of the cavity 31 can also be performed as one process. In the structure of the present embodiment, the filler 50 is disposed in only the cavity 31 of the minimum area, and thus, it is possible to fill the entire cavity 31 with the filler 50 by simplifying the control of the amount of filler to be applied.

The above embodiments have described the connections of the main ICs constituting the integrated optoelectronic module and the heat dissipation path. To mount the integrated optoelectronic module on a higher level device, the integrated optoelectronic module needs to be housed in a casing. The following embodiments will describe heat dissipation structures including a casing.

Sixth Embodiment

Figure 6:
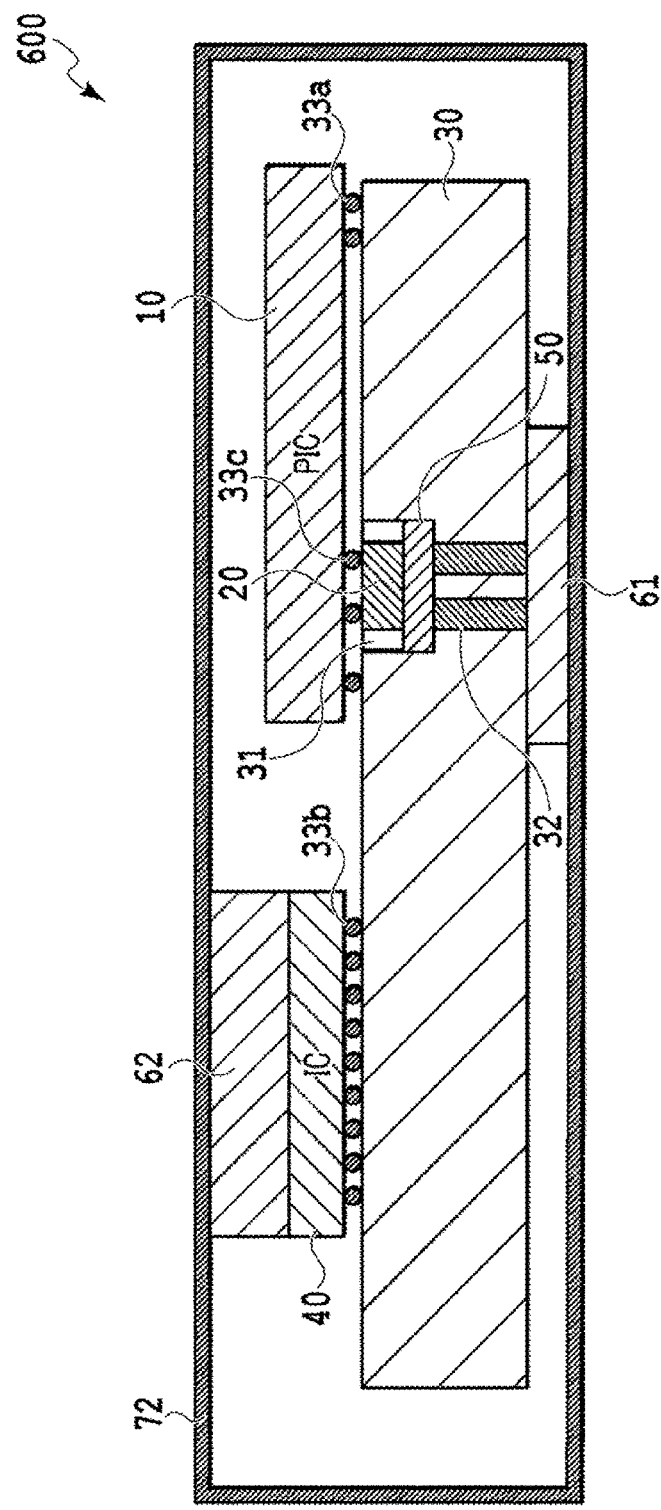
FIG. 6 illustrates a structure of an integrated optoelectronic module according to a sixth embodiment.

FIG. 6 illustrates a structure of the sixth embodiment of the integrated optoelectronic module according to the present disclosure. For the integrated optoelectronic modules according to the first to fifth embodiments, descriptions have been made for only the constituent elements relating to the photonic IC 10 implementing the main functionality of the module, at least two kinds of the electric ICs 20 and 40, and the substrate 30 having the photonic IC 10 and the electric ICs 20 and 40. An integrated optoelectronic module 600 in FIG. 6 includes, in addition to the constituent elements of the integrated optoelectronic modules described above, a casing 72 for housing the entire integrated optoelectronic module 600. The structure of the first electric IC 10 and the structure of cavity mounted on the substrate 30 correspond to those in the integrated optoelectronic module 300 according to the third embodiment illustrated in FIG. 3. The following thus describes a heat dissipation structure between the casing 72 and the integrated optoelectronic module 300.

The second electric IC 40 mounted on the substrate 30 is thermally coupled to a first surface (upper casing surface in FIG. 6) of the casing 72 with a heat transfer member 62 interposed between the second electric IC 40 and the casing 72. The first electric IC 20 is thermally coupled to a second surface (lower casing surface in FIG. 6) of the casing 72 with the filler 50, the heat dissipation vias 32, and the heat transfer member 61 that are interposed between the first electric IC 20 and the casing 72. With the structure of heat dissipation path of the integrated optoelectronic module in FIG. 6, heat from the second electric IC 40 and heat from the first electric IC 20 are separately discharged toward the respective surfaces of the casing 72. As the heat transfer members 61 and 62, for example, heat dissipation sheets or heat dissipation paste can be used. The new heat dissipation path routed via the cavity of the integrated optoelectronic module according to the present disclosure described in the first to fifth embodiments is extended to the outside, and as a result, efficient heat dissipation can be achieved. The integrated optoelectronic module 600 according to the present embodiment can be used as a very compact device housing the substrate 30 having a photonic IC and at least two kinds of electric ICs. The integrated optoelectronic module 600 according to the present embodiment can be used to configure, for example, a C form-factor pluggable (CFP), quad small form-factor pluggable (QSFP) optical transceiver as described in Non-Patent Literature 1.

Seventh Embodiment

Figure 7:
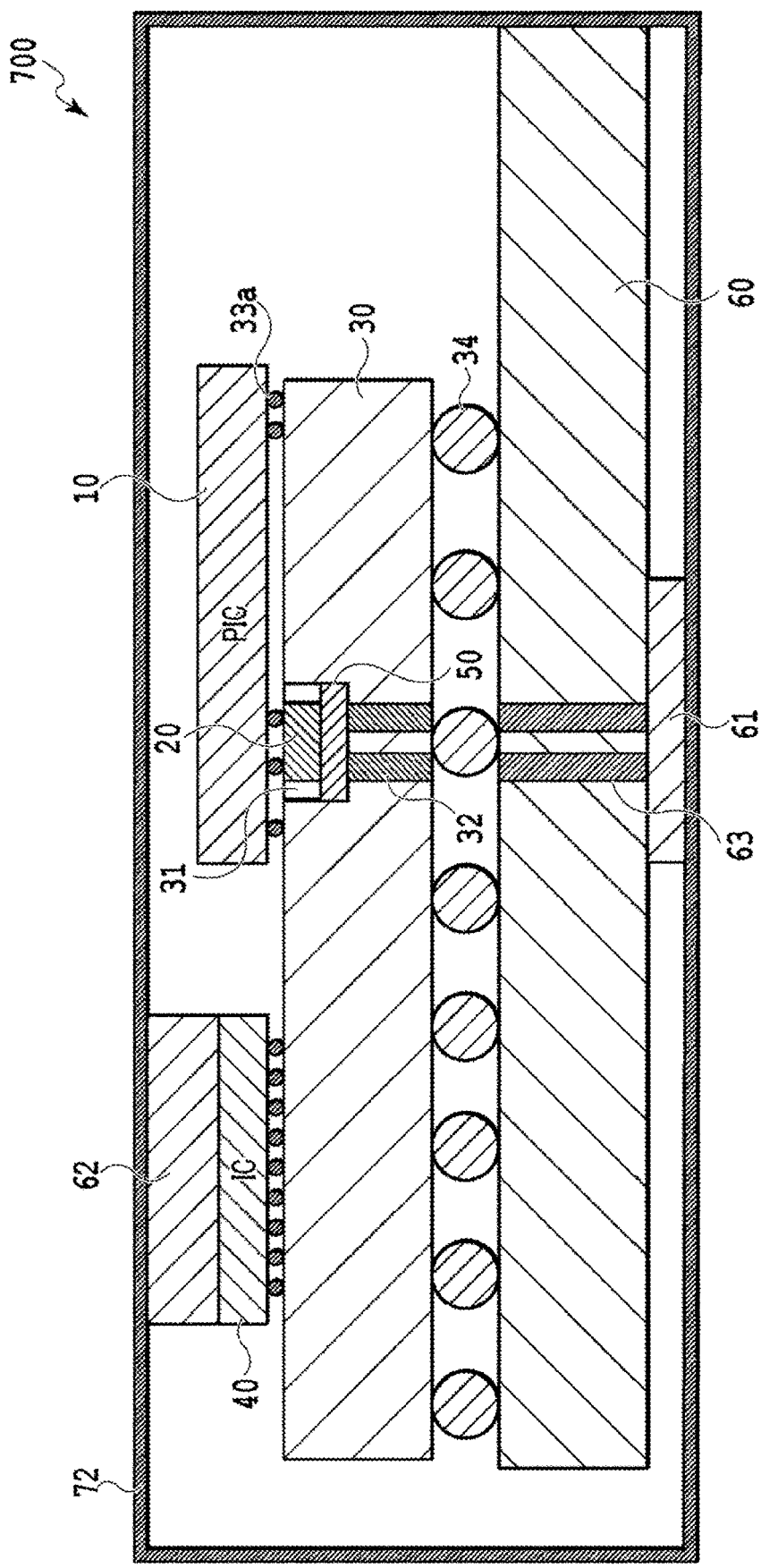
FIG. 7 illustrates an example of a structure of a device including an integrated optoelectronic module according to the present disclosure.

FIG. 7 illustrates a structure of the seventh embodiment of the integrated optoelectronic module according to the present disclosure. An integrated optoelectronic module 700 according to the present embodiment indicates an example of a structure formed by housing in the casing 72 the substrate 30 of the embodiments described above in the state in which the substrate 30 is mounted on another substrate 60. Thus, the following is a description of a heat dissipation structure in the state in which the integrated optoelectronic module having the new heat dissipation path for the electric IC routed via the cavity formed in the substrate 30 is mounted on a higher level device. The integrated optoelectronic module 700 according to the present embodiment may be the integrated optoelectronic module in FIG. 7 or another device including an integrated optoelectronic module.

Also in the integrated optoelectronic module 700 in FIG. 7, the second electric IC 40 is thermally coupled to the first surface (upper casing surface in FIG. 6) of the casing 72 with the heat transfer member 62 interposed between the second electric IC 40 and the casing 72. The entire substrate 30 of the integrated optoelectronic module is mounted on the second substrate 60, which is larger than the substrate 30 and included in the device, with the solder balls 34 interposed between the substrates 30 and 60. When the structure includes the other substrate 60 having the substrate 30, the other substrate 60 also has heat dissipation vias 63; the heat dissipation vias 32 of the substrate 30 are thermally coupled to the heat dissipation vias 63 of the second substrate 60 with the solder balls 34 therebetween. The second substrate 60 is thermally coupled to the second surface (lower casing surface in FIG. 6) of the casing 72 with the heat transfer member 61 interposed between the second substrate 60 and the casing 72.

By using the heat dissipation paths described above, the path for discharging heat from the second electric IC 40 toward the upper surface of the casing 72 can be separated from the path for discharging heat from the first electric IC 20 toward the lower surface of the casing 72 through the heat transfer member 61 of the other substrate 60. The heat dissipation vias 63 and 32 are thermally coupled to each other by the solder balls 34 in the present embodiment, but another kind of thermally conductive member may be used to couple the heat dissipation vias 63 and 32.

In all the embodiments described above, the first electric IC and the second electric IC are different from each other with respect to the function and the amount of heat generation. Because the second electric IC 40 generates a relatively large amount of heat, the second electric IC 40 is mounted directly on the substrate 30. Conversely, the first electric IC 20 generates a relatively small amount of heat, and thus, the first electric IC 20 is mounted on the photonic IC in the state in which the connection surface of the first electric IC 20 faces the connection surface of the photonic IC; however, sufficient heat dissipation is necessary to improve the performance and reliability of electronic devices included in the first electric IC 20. For example, the second electric IC 40 may be a DSP for high-speed signal processing, and the first electric IC 20 may include a driver circuit for driving an optical circuit. Further, the embodiments described above include the single first electric IC 120 and the single second electric IC 40, but two or more first electric ICs 120 and two or more second electric IC 40 may be included. The first electric IC 20 and the photonic IC 10 may be constructed in various forms including a bare chip, a chip mounted on another interposer or frame, or the like, and a module.

As described in detail above, in the integrated optoelectronic module according to the present disclosure, at least one electric IC is coupled to the photonic IC in the state in which the connection surface of the electric IC faces the connection surface of the photonic IC, and the electric IC is housed in the depressed portion formed in the substrate in the state in which the upper and lower surfaces of the electric IC are reversed. By thermally coupling the non-connection surface of the electric IC to the substrate with the filler between the electric IC and the substrate, it is possible to form a heat dissipation path different from a heat dissipation path for another electric IC. Accordingly, the electric ICs different from each other with respect to the amount of heat generation can be arranged close to each other. This structure contributes to size miniaturization, high density integration, and high frequency performance of the integrated optoelectronic module.

The structures according to the different embodiments described above can be implemented by being combined with each other as appropriate. As might be expected, for example, the integrated optoelectronic modules according to the first to fifth embodiments can be used in the heat dissipation structure of the device of the sixth or seventh embodiment

INDUSTRIAL APPLICABILITY

The present invention can be usually used in optical communication systems.

REFERENCE SIGNS LIST

10 Photonic IC
20, 40 Electric IC
22 Electric wiring region
30, 60 Substrate
31, 31d Depressed portion (cavity)
31a Cavity region
31b, 31c Opening
32, 63 Heat dissipation via
33a, 33b, 33c Connections
34 Solder ball
50 Filler
51 Underfill
61, 62 Heat transfer member
70 Casing
100, 200, 300, 400, 500, 600, 800 Integrated optoelectronic module
700 Device

The invention claimed is:

1. An integrated optoelectronic module comprising:
a substrate;
a photonic integrated circuit (IC) mounted on the substrate with a plurality of connections interposed between the photonic IC and the substrate;
a first electric IC mounted to face a connection surface of the photonic IC, the first electric IC being electrically coupled to the photonic IC with a plurality of connections interposed between the first electric IC and the photonic IC; and
a second electric IC mounted on the substrate with a plurality of connections interposed between the second electric IC and the substrate, wherein
the first electric IC is housed in a depressed portion formed in the substrate inside a region corresponding to the photonic IC when a substrate surface is viewed, and a bottom surface of the depressed portion is connected to an opposite surface of the first electric IC with a filler interposed between the depressed portion and the first electric IC, the opposite surface being opposite to a connection surface of the first electric IC.

2. The integrated optoelectronic module according to claim 1, wherein
the first electric IC and the photonic IC are formed as bare chips,
the photonic IC and the substrate are flip-chip mounted to each other by the plurality of connections, and
the photonic IC and the first electric IC are flip-chip mounted to each other by the plurality of connections.

3. The integrated optoelectronic module according to claim 1, further comprising:
a heat dissipation via extended through the substrate in a region corresponding to the first electric IC when the substrate surface is viewed.

4. The integrated optoelectronic module according to claim 1, further comprising:
an opening elongated contiguously from an inner surface of the depressed portion to a side portion of the substrate, the opening being open at the substrate surface outside the region corresponding to the photonic IC.

5. The integrated optoelectronic module according to claim 1, wherein
the bottom surface of the depressed portion includes a second bottom surface formed at a level deeper than the bottom surface of the depressed portion in a thickness direction of the substrate over the region corresponding to the first electric IC and a surrounding region, and the filler is disposed in only a second depressed portion defined by the second bottom surface.

6. The integrated optoelectronic module according to claim 1, wherein
a filler being a same as the filler is disposed around the plurality of connections between the photonic IC and the substrate.

7. A device comprising:
the integrated optoelectronic module according to claim 1; and
a casing holding the integrated optoelectronic module, the casing having a first casing surface thermally coupled to an opposite surface of the second electric IC, the opposite surface being opposite to a connection surface of the second electric IC, and a second casing surface thermally coupled, via a heat transfer member, to an opposite surface of the substrate opposite to the connection surface of the photonic IC.

8. A device comprising:
a second substrate having the integrated optoelectronic module according to claim 1; and
a casing holding the second substrate, the casing having a first casing surface thermally coupled to an opposite surface of the second electric IC, the opposite surface being opposite to a connection surface of the second electric IC, and a second casing surface thermally coupled to the second substrate, wherein
a heat transfer member is disposed on the opposite surface of the second electric IC, and the heat dissipation member is thermally coupled to the first casing surface, and
a heat dissipation via coupled to the bottom surface of the depressed portion in the substrate is thermally coupled to a heat dissipation via extended through the second substrate and is further thermally coupled to the second casing surface with a heat transfer member interposed between the heat dissipation via and the second casing surface.

* * * * *